United States Patent
Kuroda et al.

(10) Patent No.: US 6,362,561 B1
(45) Date of Patent: Mar. 26, 2002

(54) PIEZOELECTRIC VIBRATION DEVICE AND PIEZOELECTRIC RESONANCE COMPONENT

(75) Inventors: Hideaki Kuroda, Toyama-ken; Ryuhei Yoshida, Toyama, both of (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 09/501,086

(22) Filed: Feb. 9, 2000

(30) Foreign Application Priority Data

Mar. 18, 1999 (JP) .............................. 11-073802

(51) Int. Cl.[7] .............................................. H01L 41/04
(52) U.S. Cl. ...................................... 310/368; 310/320
(58) Field of Search ................................ 310/312, 320, 310/367, 368

(56) References Cited

U.S. PATENT DOCUMENTS

| | | | | |
|---|---|---|---|---|
| 2,505,121 A | * | 4/1950 | Knights | 310/312 |
| 2,799,789 A | * | 7/1957 | Wolfskill | 310/312 |
| 3,593,213 A | * | 7/1971 | Franx et al. | 333/143 |
| 3,781,721 A | * | 12/1973 | Judd et al. | 333/151 |
| 4,124,809 A | * | 11/1978 | Engdahl et al. | 310/361 |
| 4,167,686 A | * | 9/1979 | Fukuyo | 310/361 |
| 4,245,173 A | * | 1/1981 | Zumsteg et al. | 310/361 |
| 4,355,257 A | * | 10/1982 | Kawashima et al. | 310/361 |
| 5,283,496 A | * | 2/1994 | Hayashi et al. | 310/312 |
| 5,311,096 A | * | 5/1994 | Kawashima | 310/361 |
| 6,114,795 A | * | 9/2000 | Tajima et al. | 310/312 |

FOREIGN PATENT DOCUMENTS

| | | | |
|---|---|---|---|
| JP | 59-140714 | * | 1/1983 |
| JP | 3-159304 | * | 7/1991 |
| JP | 3-165111 | * | 7/1991 |
| JP | 9-046167 | * | 2/1997 |
| JP | 11-355094 | * | 12/1999 |

* cited by examiner

Primary Examiner—Karl Tamai
Assistant Examiner—Peter Medley
(74) Attorney, Agent, or Firm—Keming & Bennett, LLP

(57) ABSTRACT

An energy-trapping piezoelectric vibration device generates a thickness shear mode and includes an elongated piezoelectric element having first and second longitudinally opposed ends, top and bottom surfaces provided between the first and second ends such that the top and bottom surfaces oppose each other, and beveled surfaces disposed at a vicinity of the first and second ends such that the thickness of the piezoelectric element gradually decreases towards the first and second ends, respectively. First and second vibration electrodes are disposed on the top surface and the bottom surface of the piezoelectric element, respectively. The first and second vibration electrodes are located at an approximate middle portion of the piezoelectric element so as to oppose each other with the piezoelectric element disposed therebetween, to define opposing portions which constitute a vibrator. A roughness of the beveled surfaces is greater than a roughness of a flat portion of the top and bottom surfaces of the piezoelectric substrate disposed beneath the vibration electrodes.

19 Claims, 3 Drawing Sheets

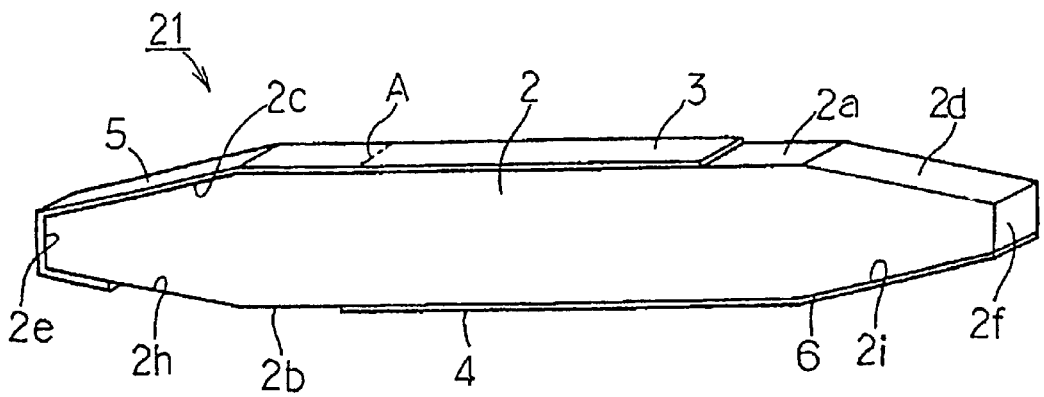
Fig. 5
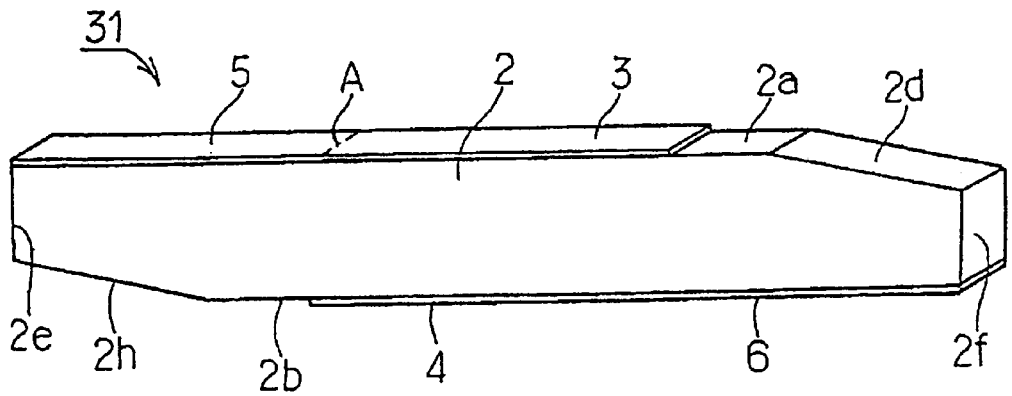
Fig. 6
Fig. 7 Prior Art
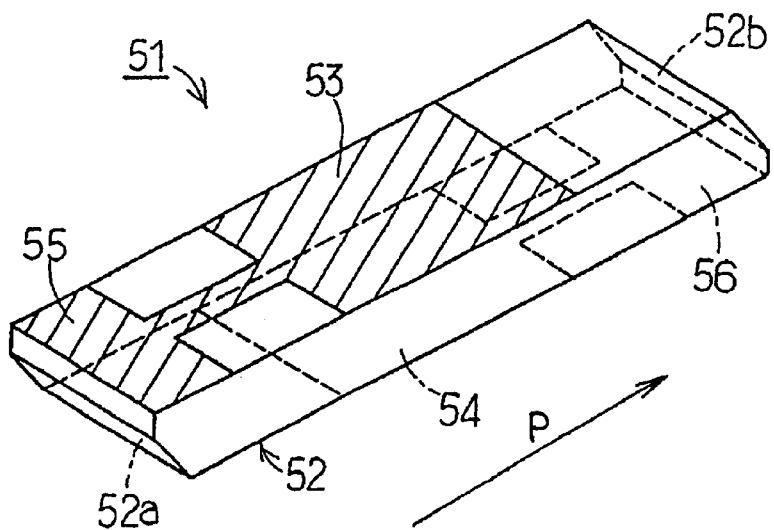

PIEZOELECTRIC VIBRATION DEVICE AND PIEZOELECTRIC RESONANCE COMPONENT

BACKGROUND OF THE INVENTION

1. Field of the Invention

The present invention relates to piezoelectric vibration devices and to piezoelectric resonance components for use in piezoelectric resonators, piezoelectric filters, and other similar devices. More specifically, the present invention relates to a piezoelectric vibration device and a piezoelectric resonance component each having a beveled surface located near each end of a piezoelectric element.

2. Description of the Related Art

Energy-trapping piezoelectric devices have been widely used in resonators, band-pass filters, and other similar devices. An example of a piezoelectric device of this sort is disclosed in Japanese Unexamined Patent Publication No. 56-165413. FIG. 7 of the present application shows a perspective view of a piezoelectric device described in the related art. A piezoelectric device 51 includes a piezoelectric substrate 52. The piezoelectric substrate 52 is polarized along a direction indicated by an arrow P in FIG. 7, that is, in a direction parallel to the main surface of the substrate 52. At the centers of the top surface and the bottom surface of the piezoelectric substrate 52, vibration electrodes 53 and 54 are provided so as to oppose each other with the piezoelectric substrate 52 disposed therebetween. The vibration electrode 53 is electrically connected to a terminal electrode 55 located at one end of the piezoelectric substrate 52. On the bottom surface of the piezoelectric substrate 52, the vibrating electrode 54 is connected to a terminal electrode 56 located on the other end of the piezoelectric substrate 52.

In the piezoelectric device 51, at least one of four ridges at longitudinal ends of the piezoelectric substrate 52 is cut along a width direction of the piezoelectric substrate 52. In other words, beveled surfaces 52a and 52b are formed at opposite ends of the substrate 52.

In the piezoelectric device 51, by properly setting dimensions of the beveled surfaces 52a and 52b, spurious responses generated due to a longitudinal mode may be suppressed.

Also, as disclosed in Japanese Unexamined Utility Model Publication No. 1-40920, a piezoelectric resonator that generates thickness shear vibration has beveled surfaces at both ends of a piezoelectric substrate. In this device, by forming a beveled surface at end of the piezoelectric substrate, energy trap efficiency is increased and filtering characteristics are improved. This publication also describes that spurious responses due to a contour mode may be suppressed, and it is easier to make the device compact.

As described in the above-mentioned related art, in an energy-trapping piezoelectric device which generates thickness shear vibration, it is known that by forming a beveled surface on a piezoelectric substrate, spurious responses due to a longitudinal mode or a contour mode may be suppressed, and energy trap efficiency may be increased.

However, in a conventional energy-trapping piezoelectric device having a beveled surfaces, a problem occurs in that by increasing energy trap efficiency, a response of a higher-order mode vibration which results in spurious responses is greatly increased.

When a thickness shear mode energy-trapping piezoelectric device is utilized as an oscillator, suppression of harmonics generated at frequencies of odd-number multiples of a fundamental vibration is absolutely necessary. When suppression of the harmonics is insufficient, oscillations are likely to occur at frequencies of odd-number multiples, such as three times, five times, and other multiples, of a transmission frequency.

SUMMARY OF THE INVENTION

To overcome the problems described above, preferred embodiments of the present invention provide an energy-trapping piezoelectric vibration device arranged to generate a thickness shear mode and to effectively suppresses spurious responses due to a longitudinal direction mode and a contour mode and also effectively suppresses spurious responses due to higher-order modes, thus realizing improved resonance and filtering characteristics.

A preferred embodiment of the present invention provides a piezoelectric vibration device having a piezoelectric element including first and second longitudinally opposed ends, top and bottom surfaces provided between the first and second ends such that the top and bottom surfaces oppose each other, and beveled surfaces disposed at a vicinity of the first and second ends such that the thickness of the piezoelectric element gradually decreases towards the first and second ends, respectively, and first and second vibration electrodes disposed on the top surface and the bottom surface of the piezoelectric element, respectively, the first and second vibration electrodes located substantially at a middle portion of the piezoelectric element so as to oppose each other with the piezoelectric element disposed therebetween to define opposing portions which constitute a vibrator, wherein a roughness of the beveled surfaces is greater than a roughness of the surface of the piezoelectric element located at the opposing portions and beneath the first and second vibration electrodes.

Preferably, Ra1−Ra2>0.3 μm is satisfied where Ra1 is the mean roughness of the center line according to Japanese Industrial Standard B0601 of the beveled surface, and Ra2 is the mean roughness of the center line of the surface of the piezoelectric element located at the opposing portions and beneath the first and second vibration electrodes.

In the present invention, the beveled surfaces may be provided on the top surface only, or the bottom surface only, or on the top and bottom surfaces.

In another preferred embodiment of the present invention, there is provided a piezoelectric resonance component including a case substrate, a piezoelectric vibration device mounted on the case substrate, and a case member mounted on the case substrate so as to enclose the piezoelectric vibration device, wherein the piezoelectric vibration device includes a piezoelectric element including first and second longitudinally opposed ends, top and bottom surfaces provided between the first and second ends such that the top and bottom surfaces oppose each other, and beveled surfaces disposed at a vicinity of the first and second ends such that the thickness of the piezoelectric element gradually decreases towards the first and second ends, respectively; and first and second vibration electrodes disposed on the top surface and the bottom surface of the piezoelectric element, respectively, the first and second vibration electrodes located substantially at a middle portion of the piezoelectric element so as to oppose each other with the piezoelectric element disposed therebetween to define opposing portions which constitute a vibrator, and wherein a roughness of the beveled surfaces is greater than a roughness of a surface of the piezoelectric element located at the opposing portions and beneath the first and second vibration electrodes.

Preferably, the above described piezoelectric resonance component further includes a capacitor device mounted on the case substrate, wherein the piezoelectric vibration device is secured on the capacitor device and mounted on the case substrate via the capacitor device, and a built-in load capacitance type oscillator is configured by the above arrangement. Note that when a capacitor device is mounted on the case substrate and when the piezoelectric vibration device is secured on the capacitor device, a piezoelectric resonance component that oscillates positively at a desired frequency and is free from abnormal oscillations or other defects is obtained.

In preferred embodiments of the present invention, since a beveled surface is provided on a piezoelectric element having an energy-trapping piezoelectric vibrator, spurious responses due to a longitudinal mode or a contour mode are effectively suppressed. Further, since the surface roughness of the beveled surface is greater than the surface roughness of the surface of the piezoelectric element located at the opposing portions and beneath the first and second vibration electrodes, spurious responses due to higher-order modes are also effectively suppressed.

Consequently, a piezoelectric vibration device that has superior energy trapping, reduced influence from unwanted spurious responses, and superior resonance and filtering characteristics is provided.

Note that, when the center line mean roughness Ra1 of the beveled surfaces and the center line mean roughness Ra2 of the flat surfaces of a piezoelectric element has a relationship expressed by Ra1−Ra2>0.3 μm, spurious responses due to higher-order modes is even more effectively suppressed.

Further, in a preferred embodiment having a pair of beveled surfaces provided in the vicinity of the ends of the top surface of a piezoelectric element and having no beveled surface provided on the bottom surface of the piezoelectric element, the piezoelectric element can have the bottom surface mounted on a case substrate, a printed circuit board or other substrate, in a very reliable and stable mounting arrangement.

When a pair of beveled surfaces are provided at the longitudinally opposed ends of the top surface and bottom surface of a piezoelectric element, the piezoelectric element can be mounted with ease on a case substrate or other type of substrate, using an automatic procedure without having to arrange the piezoelectric element to have a certain directional orientation, because the top and bottom surfaces have identical configurations.

In preferred embodiments of the present invention, the piezoelectric vibration device may be made of piezoelectric ceramic material, piezoelectric single crystal material or other suitable piezoelectric material so that various resonance characteristics and filtering characteristics can be realized with ease by controlling the composition of the piezoelectric material.

In a piezoelectric resonance component according to a preferred embodiment of the present invention, since a piezoelectric vibration device according to a preferred embodiment is mounted on a case substrate, and a casing member is fixed to the case substrate so as to surround the piezoelectric vibration device, a piezoelectric resonance component having greatly improved resonance characteristics and filtering characteristics, in which unwanted spurious responses are suppressed, and which is capable of being easily mounted on a printed circuit board or other substrate, can be provided.

Further, in a piezoelectric resonance component according to a preferred embodiment of the present invention, when a capacitor device mounted on a case substrate is provided, a piezoelectric vibration device is securely mounted on the capacitor device, and a built-in load capacitance type piezoelectric oscillator includes a piezoelectric vibration device and a capacitor device, the built-in load capacitance type piezoelectric oscillator can be configured by a single piezoelectric resonance component, and a piezoelectric vibration device according to a preferred embodiment of the present invention is provided therein. As a result, a piezoelectric resonance component which positively oscillates at a desired frequency and is free from abnormal oscillations or other problems, is provided.

Other features, elements and advantages of the present invention will be described in detail below with reference to preferred embodiments of the present invention and the attached drawings.

BRIEF DESCRIPTION OF THE ATTACHED DRAWINGS

The present invention will become more fully understood from the detailed description given herein below and the accompanying drawings which are given by way of illustration only, and thus do not limit the present invention and wherein:

FIG. 1 shows a perspective view of a piezoelectric vibration device according to a first preferred embodiment of the present invention;

FIG. 2 is a chart showing the relationship between Ra1 and Ra2, and more specifically, between the surface roughness Ra1 of the beveled surfaces and the surface roughness Ra2 of the surfaces of the piezoelectric substrate that is beneath the vibration electrodes, and the response of spurious response due to a third harmonic wave in a piezoelectric vibration device of the first preferred embodiment;

FIG. 5 shows a perspective view of a piezoelectric vibration device according to a second preferred embodiment of the present invention;

FIG. 6 shows a perspective view of a piezoelectric vibration device according to a third preferred embodiment of the present invention; and FIG. 7 shows a perspective view of a prior art piezoelectric vibration device.

DETAILED DESCRIPTION OF PREFERRED EMBODIMENTS

Figure 1:
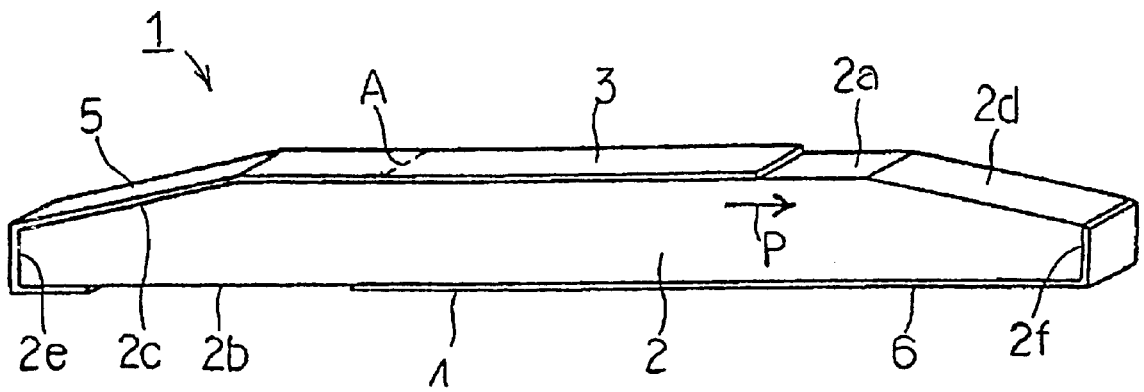

FIG. 1 shows a perspective view of a piezoelectric vibration device according to a first preferred embodiment of the present invention.

A piezoelectric vibration device 1 is an energy-trapping piezoelectric resonator adapted to be vibrated in a thickness shear vibration mode.

The piezoelectric vibration device 1 preferably includes a piezoelectric substrate 2. The piezoelectric substrate 2 in the present preferred embodiment preferably includes PZT-based piezoelectric ceramics, and is polarized in the direction of an arrow P, as illustrated in FIG. 1. In other words, the piezoelectric substrate 2 is polarized in a direction that is substantially parallel to a top surface 2a and a bottom surface 2b of the piezoelectric substrate 2 along the longitudinal direction of the piezoelectric substrate 2.

The piezoelectric substrate 2 may be made of piezoelectric ceramics other than PZT-based piezoelectric ceramics, and alternatively may be made of a piezoelectric single crystal such as quartz or other similar substances. Further, instead of the piezoelectric substrate 2, a rod-shaped or shape different than a board-like piezoelectric device may be used.

On the top surface 2a of the piezoelectric substrate 2, beveled surfaces 2c and 2d are preferably provided by forming bevels at the vicinity of the ends of the piezoelectric substrate 2. More specifically, the beveled surfaces 2c and 2d are preferably made by width-wise cutting of ridges defined by the top surface 2a and the side surfaces 2e and 2f of the piezoelectric substrate 2. On the beveled surfaces 2c and 2d, the piezoelectric substrate 2 is configured such that the thickness thereof is gradually reduced toward the ends of the piezoelectric substrate 2. The beveled surfaces 2c and 2d preferably define planar slopes which approach the bottom surface 2b toward the ends of the piezoelectric substrate 2. However, the beveled surfaces 2c and 2d may be curved surfaces or other shaped surfaces as well.

On the other hand, in the approximate center of the top surface 2a of the piezoelectric substrate 2, a first vibration electrode 3 is provided, and in the approximate center of the bottom surface 2b of the piezoelectric substrate 2, a second vibration electrode 4 is provided. The first and the second vibration electrodes 3 and 4 are provided at the approximate center in the longitudinal direction of the piezoelectric substrate 2 so as to oppose each other via the piezoelectric substrate 2. The portion where the vibration electrodes 3 and 4 overlap and are vertically opposed constitutes a piezoelectric vibrator.

The vibration electrode 3 is connected to an extended electrode 5, which is extended so as to reach the bottom surface 2b of the piezoelectric vibrator via the beveled surface 2c and the side surface 2e. Note that the vibration electrode 3 and the extended electrode 5 are preferably simultaneously formed of the same material. In other words, the extended electrode 5 is integral with and connected to the vibration electrode 3. Accordingly, in order to clarify a boundary between the vibration electrode 3 and the extended electrode 5, the boundary is shown by a dotted line A in FIG. 1.

On the other hand, an extended electrode 6 is linked to the vibration electrode 4 provided on the bottom surface 2b of the piezoelectric substrate 2. The extended electrode 6 is arranged so as to reach the ridge between the bottom surface 2b and the side face 2f of the piezoelectric substrate 2 from the piezoelectric vibrator.

In the piezoelectric vibration device 1 of the present preferred embodiment, the surface roughness of the beveled surfaces 2c and 2d of the piezoelectric substrate 2 is greater than the surface roughness of the top surface 2a and the bottom surface 2b of the piezoelectric substrate 2. In other words, the surface roughness of the beveled surfaces 2c and 2d is greater than the surface roughness of the surface portions of the piezoelectric substrate 2 beneath the vibration electrodes 3 and 4.

In the piezoelectric vibration device 1 of the present preferred embodiment, since the piezoelectric substrate 2 is polarized in the direction of an arrow P in FIG. 1, by applying an alternating voltage between the vibration electrodes 3 and 4, the piezoelectric vibration device 1 can be operated as a piezoelectric resonator generating a thickness shear mode. In this case, since the beveled surfaces 2c and 2d are arranged as described above, spurious responses due to a longitudinal mode or a contour mode can be effectively suppressed, and energy trapping efficiency can be increased.

In addition, since the surface roughness of the beveled surfaces 2c and 2d is greater than the surface roughness of the surfaces of the piezoelectric substrate beneath the vibration electrodes 3 and 4, spurious responses of higher-order modes can be effectively suppressed and minimized.

Preferably, assuming that the mean roughness of the center line of the beveled surfaces is based according to Japanese Industrial Standard B0601 and is Ra1, and the mean roughness of the center line of the surfaces of the piezoelectric substrate beneath the vibration electrodes 3 and 4 is Ra2, the expression Ra1−Ra2>0.3 $\mu$m is preferably satisfied. This relation is hereinafter described with reference to FIG. 2.

Figure 2:
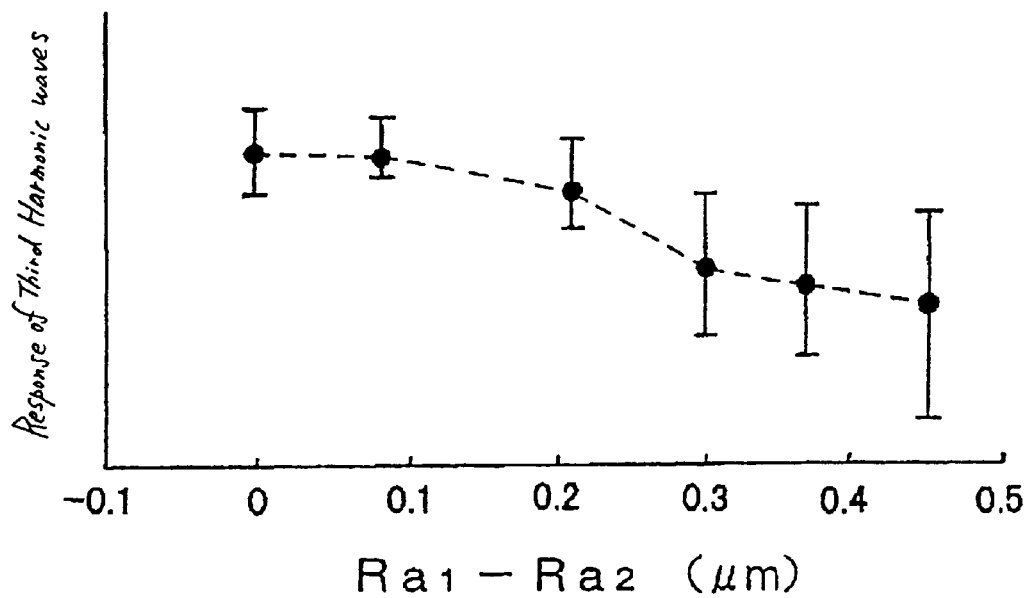

In the piezoelectric vibration device 1 of the present preferred embodiment, piezoelectric vibration devices having various degrees of surface roughness were made, and FIG. 2 shows a chart of the results that were obtained from the relationship between the magnitude of the responses of third harmonic waves obtained in the piezoelectric vibration devices and the corresponding values obtained from the above described expression Ra1−Ra2.

Note that for this experiment, as a piezoelectric vibration device 1, a piezoelectric vibration device made of PZT is used, and had dimensions of approximately 5.4 mm long, 0.5 mm wide, and 0.6 mm thick, and had a longitudinal dimension of the beveled surfaces 2c and 2d of 1.2 mm and a distance between the lower ends of the beveled surfaces 2c and 2d and the top surface of the piezoelectric substrate of 0.23 mm, and an opposing area of the vibration electrodes 3 and 4 of 1.25 mm2.

As is clear from FIG. 2, when the value of Ra1−Ra2 is positive, if the value of Ra1−Ra2 increases. In other words, as the relative surface roughness of the beveled surface 2c and 2d increases, the response of the third-harmonic wave decreases. Specifically, if the value of Ra1−Ra2 becomes larger than about 0.3 $\mu$m, it is clear that spurious responses due to the response of the third harmonic wave can be effectively suppressed.

There is no specific limitation on the methods for forming beveled surfaces 2c and 2d, and for roughening the beveled surfaces 2c and 2d. In other words, a rotating grinding tool may be used for grinding a portion near both ends of the top surface 2a of the piezoelectric substrate 2, and for forming the beveled surfaces 2c and 2d of predetermined surface roughness. In addition, after forming the beveled surfaces 2c and 2d by using a cutter or other similar devices, a rotating grinding tool, sand blasting, or other similar devices may be used for roughening the beveled surfaces 2c and 2d.

Further, although there is no specific need to grind the top surface 2a and the bottom surface 2b of the piezoelectric substrate 2, in order to realize the surface roughness relative to the beveled surfaces 2c and 2d, lapping, for example, may be used to make the surfaces 2a and 2b more smooth.

Further, it is desired that the surface roughness of the beveled surfaces 2c and 2d be larger than the surface roughness of the top surface 2a and the bottom surface 2b as previously described, and grinding marks may remain on the surface of the beveled surfaces 2c and 2d.

Although, in the present preferred embodiment, the surface roughness of the entire top surface 2a and bottom surface 2b, and the entire beveled surfaces 2c and 2d are smaller than the surface roughness of the beveled surfaces 2c and 2d, it also can be configured such that the roughness of only the portions of the piezoelectric substrate surface beneath the vibration electrodes 3 and 4 is less than the surface roughness of the beveled surfaces 2c and 2d.

In the piezoelectric vibration device according to the first preferred embodiment, since not only spurious responses due to a contour mode or a longitudinal mode are large, but also the surface roughness of the beveled surfaces 2c and 2d is greater than the surface roughness of the top surface 2a and the bottom surface 2b of the piezoelectric substrate 2, spurious responses due to higher-order modes can be suppressed, and thereby improved resonance characteristics can be obtained.

In addition, the beveled surfaces 2c and 2d are provided in the vicinity of the ends of the top surface 2a, and no beveled surface is provided on the bottom surface 2b. In other words, when viewed from the side, the piezoelectric vibration device 1 is shaped like a trapezoid. Consequently, the piezoelectric vibration device 1 can be mounted, from the bottom surface 2b, on a printed circuit board or other similar devices in a stable way for packaging.

Since the electrodes 5 and 6 are arranged to reach the side surfaces 2e and 2f, respectively, if mounted on a printed circuit board, a soldering fillet can be easily provided, thus improving packaging reliability.

Figure 3:
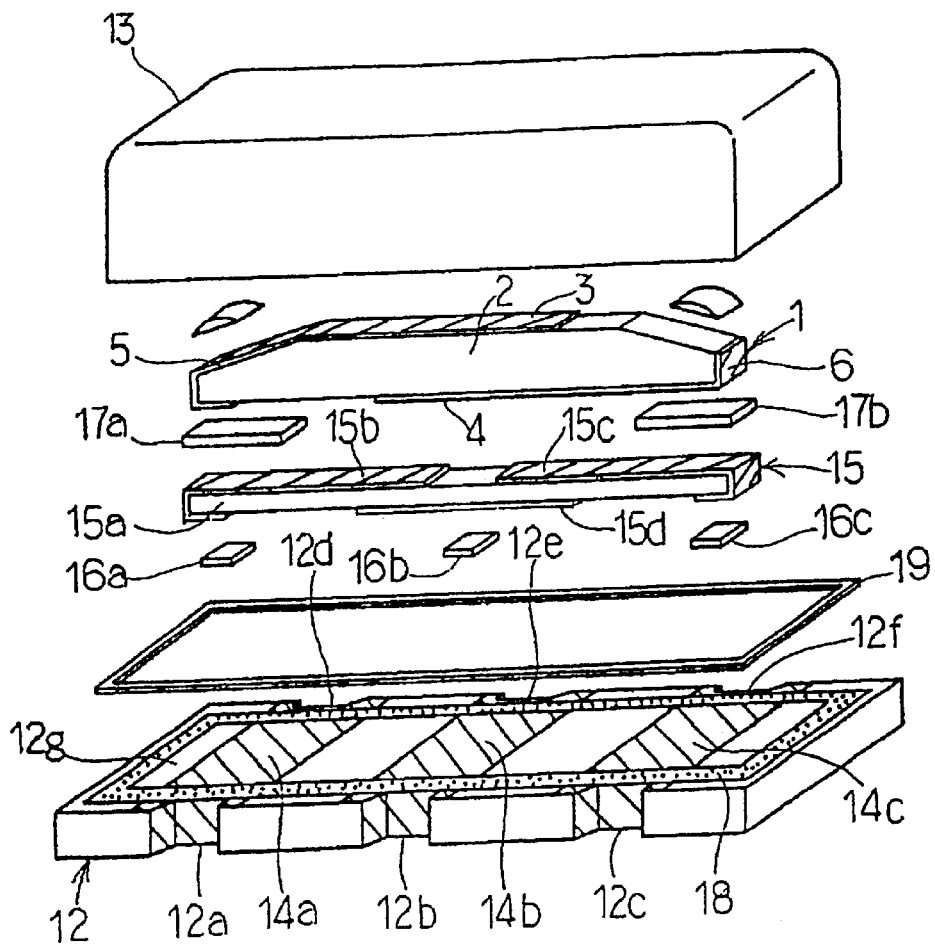
FIG. 3 shows an exploded perspective view of a piezoelectric resonance component according to another preferred embodiment of the present invention.
Figure 4:
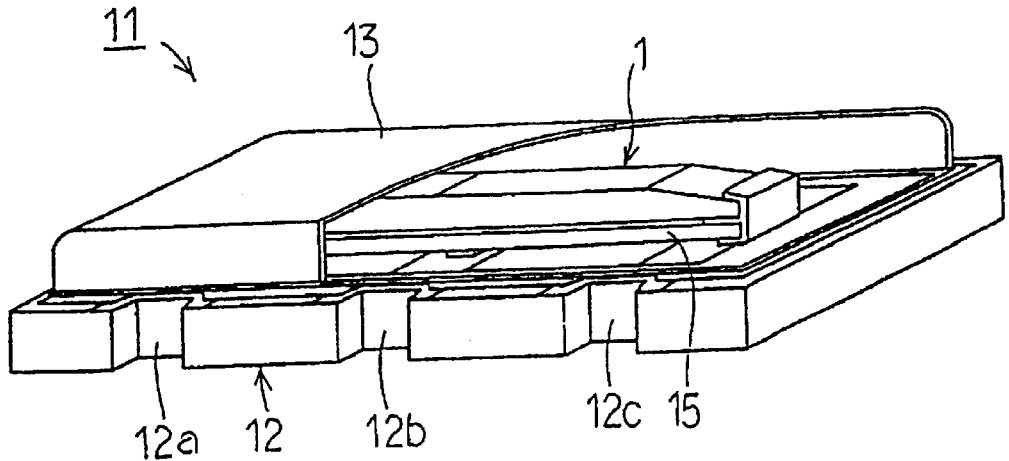
FIG. 4 shows a partially cut perspective view illustrating the piezoelectric resonance component according to another preferred embodiment of the present invention.

FIGS. 3 and 4, respectively, show an exploded perspective view and a partially cutaway perspective view of a piezoelectric resonance component including a piezoelectric vibration device 1 of the first preferred embodiment.

In a piezoelectric resonance component 11, a package has a case substrate 12, and a metal cap 13, which is a casing member. The case substrate 12 is made of an insulating material such as alumina or the like, and has notches 12a to 12c on one of the side surfaces, and notches 12d to 12f on the other side surface. The notches 12a to 12c and the notches 12d to 12f respectively oppose each other. On the top surface of the piezoelectric substrate 12, terminal electrodes 14a to 14c are arranged so as to respectively extend in the width direction of the piezoelectric substrate 12. The terminal electrodes 14a to 14c are arranged to reach not only a top surface 12g, but also the inside of the above described notches 12a, 12d, 12b, 12e, 12c and 12f, respectively.

Further, on the case substrate 12, a capacitor device 15 and the piezoelectric vibration device 1 are preferably provided and packaged therein.

The capacitor device 15 preferably includes a dielectric substrate 15a. On the top surface of the dielectric substrate 15a, capacitor electrodes 15b and 15c are provided at the approximate center thereof with a predetermined gap therebetween. The capacitor electrodes 15b and 15c are each arranged to reach the bottom surface of the dielectric substrate 15a via the terminal surfaces at both longitudinal ends thereof. Further, the capacitor device 15 preferably has a capacitor electrode 15d provided at the approximate center of the bottom surface of the dielectric substrate 15a.

The portion of the capacitor electrode 15b reaching the bottom surface of the dielectric substrate 15a is electrically connected to the terminal electrode 14a by a conductive adhesive 16a. A capacitor electrode 16d is also electrically connected to the terminal electrode 14b by a conductive adhesive 16b. The portion of the capacitor electrode 15c extending to the bottom surface of a dielectric substrate is electrically connected to the terminal electrode 14c by a conductive adhesive 16c. As described above, the capacitor device 15 is electrically connected to the terminal electrodes 14a to 14c, and secured on the case substrate 12.

Further, on the top surface of the capacitor device 15, the piezoelectric vibration device 1 is bonded via conductive adhesives 17a and 17b. The extended electrode 5 of the piezoelectric vibration device 1 is electrically connected to the capacitor electrode 14b by the conductive adhesive 17a. The extended electrode 6 is electrically connected to the capacitor electrode 15c by the conductive adhesive 17b. Then, the metal cap 13 is bonded to the case substrate 12 via an insulating paste 18 and an adhesive 19.

Consequently, in the piezoelectric resonance component 11 of the present preferred embodiment, a three-terminal type built-in load capacitance type piezoelectric oscillator including the piezoelectric vibration device 1 and the capacitor device 15 is configured in a package having the case substrate 12 and the metal cap 13.

FIG. 5 shows a perspective view of a piezoelectric vibration device according to a second preferred embodiment of the present invention.

In a piezoelectric vibration device 21, beveled surfaces 2h and 2i are also provided at the vicinity of ends thereof on the bottom surface 2b of the piezoelectric substrate 2. In other words, not only are the beveled surfaces 2c and 2d provided on the top surface 2a of the piezoelectric substrate 2, but also the beveled surfaces 2h and 2i are provided on the bottom surface 2b thereof.

The beveled surfaces 2h and 2i are arranged to be symmetrical to the beveled surfaces 2c and 2d around the horizontal surface including the approximate center in the thickness direction of the piezoelectric substrate 2.

Further, the extended electrode 5 is arranged so as to reach the half way point of the downwardly beveled surface 2h from the beveled surface 2c via a side surface 2e, while the extended electrode 6 is arranged to reach the beveled surface 2i from the bottom surface 2b of the piezoelectric substrate 2.

Like the piezoelectric vibration device 2 of the present preferred embodiment, a pair of the beveled surfaces 2h and 2i may also be provided on the bottom surface 2b of the piezoelectric substrate 2. In this case, the surface roughness of the beveled surfaces 2h and 2i is also greater than the piezoelectric substrate surface beneath the vibration electrodes 3 and 4. Consequently, in a similar way to the case of the first preferred embodiment, spurious responses due to higher-order modes can also be effectively suppressed in the second preferred embodiment.

In addition, in the piezoelectric vibration device 21 of the second preferred embodiment, the shapes of the top surface and the bottom surface of the piezoelectric substrate 2 are preferably substantially the same and are symmetrical. Consequently, the piezoelectric vibration device 21 can be supplied to an automatic inserting and mounting apparatus without arranging the directionality of the device, thus improving automation of mounting the device on a printed circuit board, a case substrate, or similar devices, and also improving the ease of mounting.

FIG. 6 shows a perspective view of a piezoelectric vibration device according to a third preferred embodiment of the present invention. In a piezoelectric vibration device 31, on the top surface 2a of a piezoelectric substrate 2, a beveled surface 2d is provided in the vicinity of a side surface 2f at one of the ends, while on the bottom surface 2b thereof, a beveled surface 2h is provided in the vicinity of a side surface 2e. In this case as well, by making the surface roughness of the beveled surfaces 2d and 2h greater than the surface roughness of the piezoelectric substrate surfaces beneath vibration electrodes 3 and 4, spurious responses due to higher-order modes can be effectively suppressed, in a similar way to the cases of the first and second preferred embodiments.

In the piezoelectric vibration device 31 of the third preferred embodiment, an extended electrode 5 is provided only on the top surface 2a of the piezoelectric substrate 2, and an extended electric 6 is also provided only on the planar bottom surface 2b of the piezoelectric substrate 2. Consequently, since an extended electrode is not required to be provided on a beveled surface, the extended electrodes 5 and 6 are provided with ease. Further, the piezoelectric vibration device 31 according to the third preferred embodiment can be easily inserted into an automated machine without first having to arrange the directionality of the device, since configurations on the top surface and the bottom surface thereof are the same, thus easily enabling packaging automation.

Although the piezoelectric vibration device according to each of the first, second, and third preferred embodiments has first and second vibration electrodes provided on main surface of the piezoelectric substrate so as to constitute a piezoelectric resonator, in the present invention, a plurality of vibration electrodes may be provided on at least one of the main surfaces of the piezoelectric substrate to constitute a piezoelectric filter.

While the invention has been particularly shown and described with reference to preferred embodiments thereof, it will be understood by those skilled in the art that the foregoing and other changes in form and details may be made therein without departing from the spirit of the invention.

What is claimed is:

1. A piezoelectric vibration device comprising:
   a piezoelectric element including first and second longitudinal edges, first and second longitudinally opposed ends, top and bottom surfaces provided between the first and second ends such that the top and bottom surface oppose each other, and beveled surfaces disposed at a vicinity of the first and second ends such that the thickness of the piezoelectric element gradually decreases towards the first and second ends, respectively; and
   first and second vibration electrodes disposed on the top surface and the bottom surface of the piezoelectric element, respectively, the first and second vibration electrodes located substantially at a middle portion of the piezoelectric element so as to opposed each other with the piezoelectric element disposed therebetween to define opposing portions which constitute a vibrator, the first and second vibration electrodes extend over substantially the entire width of the piezoelectric element from the first longitudinal edge to the second longitudinal edge;
   wherein a roughness of the beveled surfaces is greater than a roughness of a surface of the piezoelectric element located at the opposing portions and beneath the first and second vibration electrodes; and
   the piezoelectric element and first and second vibration electrodes are arranged to generate a thickness shear mode and to suppress spurious responses due to a longitudinal direction mode and a contour mode.

2. The piezoelectric vibration device according to claim 1, wherein a relationship Ra1−Ra2>0.3 µm is satisfied, where Ra1 is a mean roughness of a center line of the beveled surfaces according to Japanese Industrial Standard B0601, and Ra2 is a mean roughness of a center line of the flat portion of the top and bottom surface.

3. The piezoelectric vibration device according to claim 1, wherein the a surface of the piezoelectric element located at the opposing portions and beneath the first and second vibration electrodes is flat.

4. The piezoelectric vibration device according to claim 1, wherein the beveled surfaces are curved surfaces.

5. The piezoelectric vibration device according to claim 1, wherein the beveled surfaces are provided on the top surface of the piezoelectric element.

6. The piezoelectric vibration device according to claim 1, wherein the beveled surfaces are provided on the bottom surface of the piezoelectric element.

7. The piezoelectric vibration device according to claim 1, wherein the beveled surfaces are provided on the top and bottom surfaces.

8. The piezoelectric vibration device according to claim 1, wherein the beveled surfaces are provided at the vicinity of the first and second ends on both the top and bottom surfaces.

9. The piezoelectric vibration device according claim 1, wherein the piezoelectric element is made of a piezoelectric ceramic material.

10. A piezoelectric resonance component comprising:
    a case substrate;
    a piezoelectric vibration device mounted on the case substrate; and
    a case member mounted on the case substrate so as to enclose the piezoelectric vibration device;
    wherein the piezoelectric vibration device includes an elongated piezoelectric element including first and second longitudinal edges, first and second longitudinally opposed ends, top and bottom surfaces provided between the first and second ends such that the top and bottom surfaces oppose each other, and beveled surfaces disposed at a vicinity of the first and second ends such that the thickness of the piezoelectric element gradually decreases towards the first and second ends, respectively, and first and second vibration electrodes disposed on the top surface and the bottom surface of the piezoelectric element, respectively, the first and second vibration electrodes located substantially at a middle portion of the piezoelectric element so as to opposed each other with the piezoelectric element disposed therebetween to define opposing portions which constitute a vibrator, the first and second vibration electrodes extend over substantially the entire width of the piezoelectric element from the first longitudinal edge to the second longitudinal edge, wherein a roughness of the beveled surfaces is greater than a roughness of a surface of the piezoelectric element located at the opposing portions and beneath the first and second vibration electrodes, and the piezoelectric element and first and second vibration electrodes are arranged to generate a thickness shear mode and to suppress spurious responses due to a longitudinal direction mode and a contour mode.

11. The piezoelectric resonance component according to claim 10, wherein a relationship Ra1−Ra2>0.3 µm is satisfied, where Ra1 is a mean roughness of a center line of the beveled surfaces according to Japanese Industrial Standard B0601, and Ra2 is a mean roughness of a center line of the flat portion of the top and bottom surface.

12. The piezoelectric resonance component according to claim 10, wherein the surface of the piezoelectric element located at the opposing portions and beneath the first and second vibration electrodes is flat.

13. The piezoelectric resonance component according to claim 10, wherein the beveled surfaces are curved surfaces.

14. The piezoelectric resonance component according to claim 10, wherein the beveled surfaces are provided on the top surface of the piezoelectric element.

15. The piezoelectric resonance component according to claim 10, wherein the beveled surfaces are provided on the bottom surface of the piezoelectric element.

16. The piezoelectric resonance component according to claim 10, wherein the beveled surfaces are provided on the top and bottom surfaces.

17. The piezoelectric resonance component according to claim 10, wherein the beveled surfaces are provided at the vicinity of the first and second ends on both the top and bottom surfaces.

18. The piezoelectric resonance component according claim 10, wherein the piezoelectric element is made of a piezoelectric ceramic material.

19. The piezoelectric resonance component according to claim 10, further comprising a capacitor device mounted on the case substrate via conductive adhesives, wherein the piezoelectric vibration device is secured on the capacitor device via conductive adhesives so that the piezoelectric vibration device is mounted on the case substrate.

* * * * *